(12) United States Patent
Li

(10) Patent No.: US 7,746,092 B2
(45) Date of Patent: Jun. 29, 2010

(54) INTELLIGENT MULTI-METER WITH AUTOMATIC FUNCTION SELECTION

(75) Inventor: Chun-Liang Li, Jhongli (TW)

(73) Assignee: Cyrustek Co., Hsinchu (TW)

( * ) Notice: Subject to any disclaimer, the term of this patent is extended or adjusted under 35 U.S.C. 154(b) by 64 days.

(21) Appl. No.: 12/237,335

(22) Filed: Sep. 24, 2008

(65) Prior Publication Data

US 2010/0013511 A1 Jan. 21, 2010

(30) Foreign Application Priority Data

Jul. 17, 2008 (TW) ............................... 97127055 A

(51) Int. Cl.
G01R 31/02 (2006.01)
G01R 15/08 (2006.01)
(52) U.S. Cl. ...................... 324/764; 324/99 D; 324/115
(58) Field of Classification Search .................. None
See application file for complete search history.

(56) References Cited

U.S. PATENT DOCUMENTS

| | | | |
|---|---|---|---|
| 5,142,221 A * | 8/1992 | Meldrum et al. ............ 324/115 |
| 5,218,290 A | 6/1993 | Beckert et al. |
| 5,250,893 A | 10/1993 | Gambill et al. |
| 5,327,016 A | 7/1994 | Su et al. |
| 5,396,168 A | 3/1995 | Heep et al. |
| 5,530,373 A | 6/1996 | Gibson et al. |
| 5,543,707 A | 8/1996 | Yoneyama et al. |
| 5,557,197 A * | 9/1996 | Schulze et al. ............. 324/115 |
| 5,572,117 A | 11/1996 | Yoon |
| 5,581,175 A | 12/1996 | Yoneyama et al. |
| 6,127,830 A | 10/2000 | Engelmann et al. |
| 6,148,347 A | 11/2000 | Finch et al. |
| 6,278,596 B1 | 8/2001 | Simpson |
| 6,466,003 B1 | 10/2002 | Gallavan et al. |
| 6,512,383 B1 | 1/2003 | Gomory et al. |
| 6,556,003 B2 | 4/2003 | Choi |
| 6,633,826 B1 | 10/2003 | Schmidt |
| 6,646,562 B1 | 11/2003 | Chang |
| 6,794,859 B2 * | 9/2004 | Choi ......................... 324/115 |
| 6,985,819 B2 | 1/2006 | Lipscomb et al. |
| 7,323,859 B2 | 1/2008 | Chen et al. |

* cited by examiner

Primary Examiner—Minh N Tang
(74) Attorney, Agent, or Firm—Ming Chow; Sinorica, LLC

(57) ABSTRACT

A measuring device with the function of automatically determining the type of device under test (DUT) and selecting measuring function. The measuring device having a controller for sequentially providing a plurality of checking phases; a protection circuit connecting to input end and protecting the measuring device; a switch composed of a plurality of test circuits, being connected to the controller and sequentially connecting the plurality of test circuits with the output end of the protection circuit; a plurality of DUT type detectors, connecting to the switch and comparing the voltage of input end sequentially through a plurality of comparison circuits, transmitting the result of comparison to the controller for determining the type of DUT; and a measurement unit connecting to the controller, measuring the DUT according to the result of determination of the controller and displaying the result of measurement on a display.

20 Claims, 10 Drawing Sheets

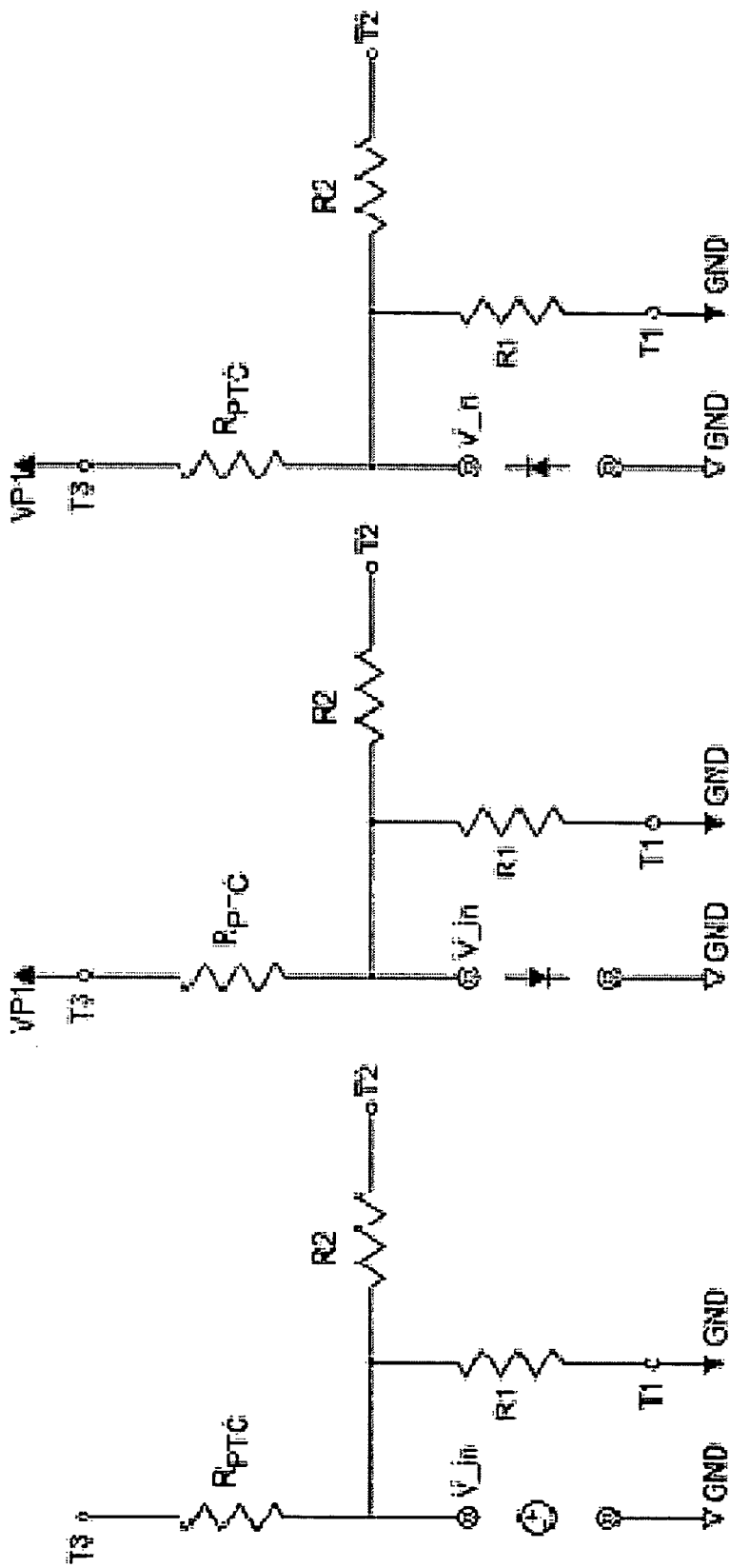

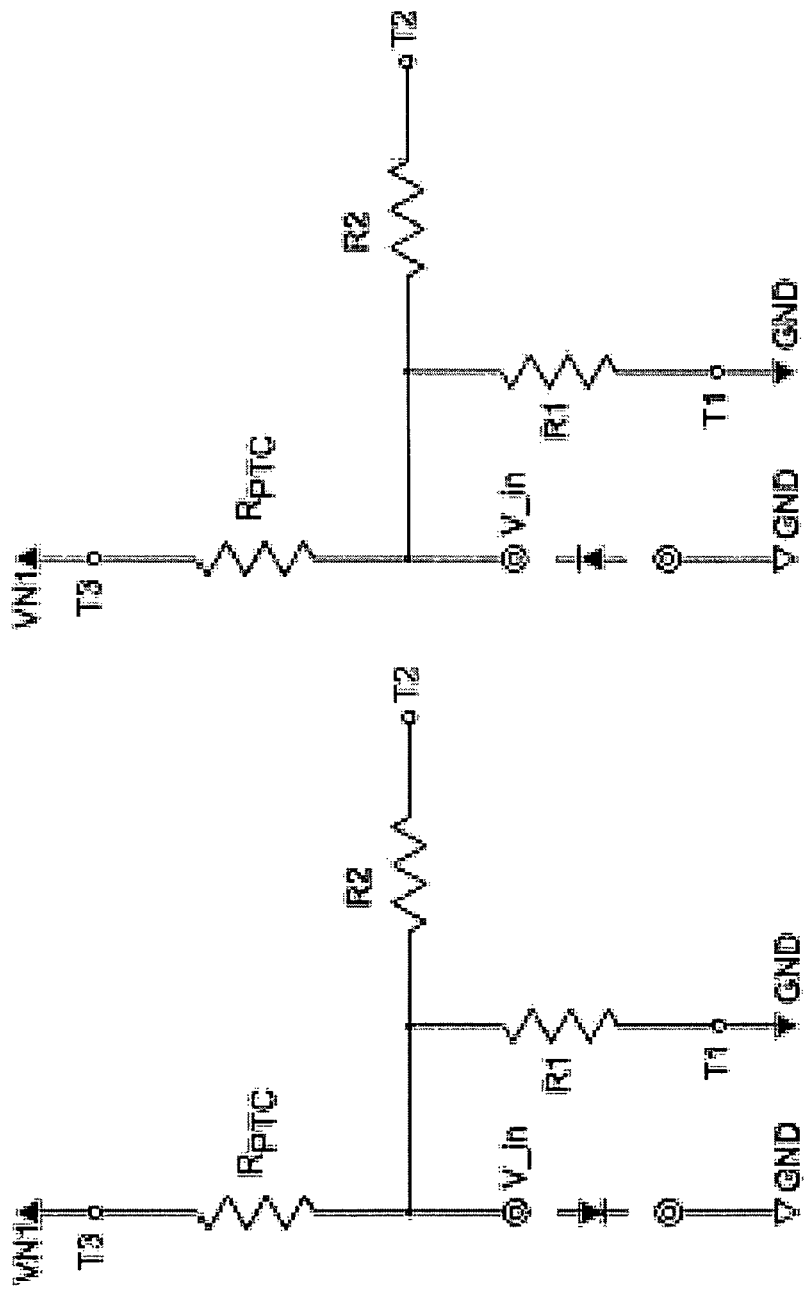

Table 1(a)

| | P_DIO_CHK | | | N_DIO_CHK | | |
|---|---|---|---|---|---|---|
| | VDD | +Vr | 0V | 0V | -Vr | VSS |
| Diode(forward) | | @ | | | | @ |
| Diode(reverse) | @ | @ | | | | |
| Small capacitance | | | | | @ | @ |
| Large capacitance | | @ | @ | | @ | |
| Small resistance | | @ | @ | @ | | |
| Large resistance | @ | | | | | @ |

Table 1(b)

| | P_DIO_CHK | | | N_DIO_CHK | | |
|---|---|---|---|---|---|---|
| | VDD | +Vr | 0V | 0V | -Vr | VSS |
| Diode(forward) | 0 | 1 | | 0 | | 1 |
| Diode(reverse) | 1 | 0 | | 1 | 1 | 0 |
| Small capacitance | 1 | 0 | | 0 | 0 | 1 |
| Large capacitance | 0 | 1 | | 1 | 1 | 0 |
| Small resistance | 0 | 1 | | 1 | 0 | 0 |
| Large resistance | 1 | 0 | | 0 | 1 | 1 |

INTELLIGENT MULTI-METER WITH AUTOMATIC FUNCTION SELECTION

BACKGROUND OF THE INVENTION

1. Field of the Invention

The present invention is related to a multi-function testing device and its testing method, and more particularly, to a measuring device with the function of automatically determining the type of device under test (DUT) without selection of switch and its testing method, for example, a multi-meter with function of automatically determining the type of DUT.

2. Description of the Prior Art

At present every automatic function selecting multi-meter is able to display digital measured values, for example, displaying direct current voltage value or alternating current voltage value, resistor value or capacitor value, diode or circuit passageway test result, etc. The above-mentioned functions are generally switched by rotating rotation knob or pressing button, and the user has to determine and select measuring function by himself and manually switch to measuring function that is selected to perform.

Although some multi-meters are claimed to be having intelligent automatic testing function, yet the so-called intelligent automatic testing function is actualized by manually adjusting the function selecting switch of multi-meter to function for measuring a DUT. For example, when the DUT is a resistor, then before the measurement, the function selecting switch of multi-meter needs to be adjusted (or switched) to the function for measuring resistor; the probe at input end is then used to measure the resistor under test, whereas the multi-meter with intelligent automatic testing function selects appropriate resistor measuring range for measuring and it is not necessary for the user to perform tests step by step from the highest resistor value (100 M ohms for example) to find the appropriate resistor value. For another example, when the DUT is under open/short detection, the function selecting switch needs to be switched to the function for open/short detection, and the multi-meter automatically performs test and displays whether the DUT is open or short.

In addition, since multi-meter is equipped with multiple functions, thus for a user not very familiar with electrical properties, it is not enough only to have a multi-meter with above-mentioned function of automatically selecting measuring range. As in the process of measuring, the user may not be able to switch to the right measuring function to be performed, which then leads to errors in measuring. For example, when a DUT is an alternating current voltage source, if the user switches to the function for measuring direct current voltage and the measurement of this signal source is performed and results in a near-zero value as measured value, then not only is the measured result erroneous, but the user is also misled to consider that the DUT is with no voltage and thus neglects the risk of electrical burns. For another example, among circuit elements, diode and resistor often have similar appearances and it is often not easy to differentiate one from another for a beginner; if a user mistakes diode to be resistor and performs measurement, a reasonable value can still be obtained, which results in misusage of electric elements without the user being aware of it.

At present there are multi-meters further equipped with function of automatically selecting DUT which helps the user select the right type of DUT, as disclosed in U.S. Pat. Nos. 5,142,221, 5,557,197, and 6,646,562. However, the automatic selecting functions as disclosed in above-mentioned patents cannot cover all of the following functions commonly used: direct current voltage/alternating current voltage/direct current/alternating current/resistor/capacitor/diode/short detection. The present invention thus provides a fast detecting process which is able to detect the type of DUT in a short time and performs measurement and detecting range of which covers all functions of above-mentioned multi-meters. The convenience of operation and the accuracy of measurement can thus be greatly enhanced.

Current multi-meters can already be operated in a simple way. However, when testing is to be actually performed on a complex circuit, there is still need to first determine what type the DUT is and then manually switch the function selecting switch of multi-meter to the appropriate function for the automatic testing function of multi-meter to operate and to obtain the measured result. In addition, when a high voltage signal is inputted, if the measuring function is wrongly selected, not only will the circuit in the measuring device be damaged, but the operator of measuring device may also be harmed. Process of such kind not only decreases the efficiency of work and causes inconvenience, but also leads to longer time in doubt and possible damages to both the measuring device and the operator, particularly when the selection of measuring function is erroneous.

It is thus clear that there is still room for improvement considering the convenience of operating multi-meter of prior art.

SUMMARY OF THE INVENTION

In order to enhance convenience of operation and accuracy of measurement for using multi-meter of prior art as described above, the present invention provides a fast detecting process which is able to detect the type of commonly used circuit element or signal within 45 ms. When no DUT is connected to the input end, the controller will determine the input end to be in open status and will not switch to the measure mode but perform detection process repeatedly. Thus, one objective of the present invention is to provide a device with function of automatically determining type of DUT to avoid the step of switching the function selecting switch to the right function according to the type of DUT for performing appropriate measurement when operating multi-meter of the prior art.

Another objective of the present invention is to provide a measuring device with function of automatically determining type of DUT, which allows the measuring device of the present invention to automatically determine the type of DUT with a plurality of circuit configurations; thus function selecting switch is not needed on the measuring device of the present invention.

Still another objective of the present invention is to provide a measuring device with function of automatically determining type of DUT, the determining procedure of the present invention being able to determine whether the DUT is voltage, current, diode, large capacitor/large resistor or small capacitor/small resistor and to automatically select appropriate measuring range for performing measurement and thus achieving the goal of fast measurement.

According to above objectives, the present invention first provides a measuring device with the function of automatically determining the type of DUT. The measuring device having a controller for sequentially providing a plurality of checking phases; a protection circuit connecting to input end and protecting the measuring device; a switch composed of a plurality of test circuits, being connected to the controller and sequentially performing switching actions according to the plurality of checking phases for sequentially connecting the plurality of test circuits with the output end of the protection circuit; a plurality of DUT type detectors connecting to the controller, sequentially comparing the voltage of input end through a plurality of comparison circuits, and transmitting the result of comparison to the controller for the controller to determine the type of DUT according to the result of comparison; and a measurement unit connecting to the controller, measuring the DUT according to the result of determination of the controller and displaying the result of measurement on a display.

The present invention then provides an intelligent multi-meter, including a display for displaying a plurality of measure modes and measured value and a pair of input terminals, the characteristic in that: the plurality of measure modes include at least an automatic scan mode that is able to automatically determine the type of the DUT connected to the pair of input terminals and selectively perform automatic value measurement on the DUT after the determination of type of DUT is completed.

The present invention further provides a measuring Method of an intelligent multi-meter, comprising: performing detection procedure, in which a controller sequentially provides a plurality of checking phases; performing switch procedure, in which the switch composed of a plurality of test circuit configurations sequentially performs switching actions according to the plurality of checking phases for sequentially connecting the plurality of test circuit configurations to the protection circuit connected to the input end; performing comparison procedure, in which the comparison circuits in the DUT type detectors sequentially compare voltage of DUT to generate the result of comparison; performing determination procedure, in which the controller determines the type of the DUT according to the result of comparison; and continuing to perform scan procedure when the input end is determined to be open, or performing measurement procedure, in which the measurement unit performs measurement on the DUT according to the result of determination of the controller and displays the result of measurement on the display.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4 is circuit configuration of V_CHK1 and V_CHK2 phases of the present invention;

FIG. 5(a) to FIG. 5(b) are circuit configurations of P_DIO_CHK phase of the present invention;

FIG. 6(a) to FIG. 6(b) are circuit configurations of N_DIO_CHK phase of the present invention;

Table 1(a) to Table 1(b) indicate different voltage value ranges of input end when different devices under test are in PDIO_CHK phase and NDIO_CHK phases in the present invention.

DESCRIPTION OF THE PREFERRED EMBODIMENT

The present invention is about a device with function of automatically determining the type of DUT, and more particularly, a measuring device with function of automatically determining the type of DUT. In order to achieve a thorough understanding of the present invention, detailed procedures of determination and composition of the determination circuit will be provided in the following description. Obviously, application of the present invention is not limited to any particular details familiar to those skilled in the art of measuring device with function of automatically determining the type of DUT. On the other hand, measuring device that automatically determines the type of DUT and measuring steps commonly known are not described in detail to avoid unnecessary limit to the scope of the present invention. Preferred embodiments of the present invention will be described in detail in the following; however, the invention is not limited to the disclosed embodiments and the scope of the appended claims should be accorded the broadest interpretation so as to encompass all modifications and similar arrangements.

Figure 1:
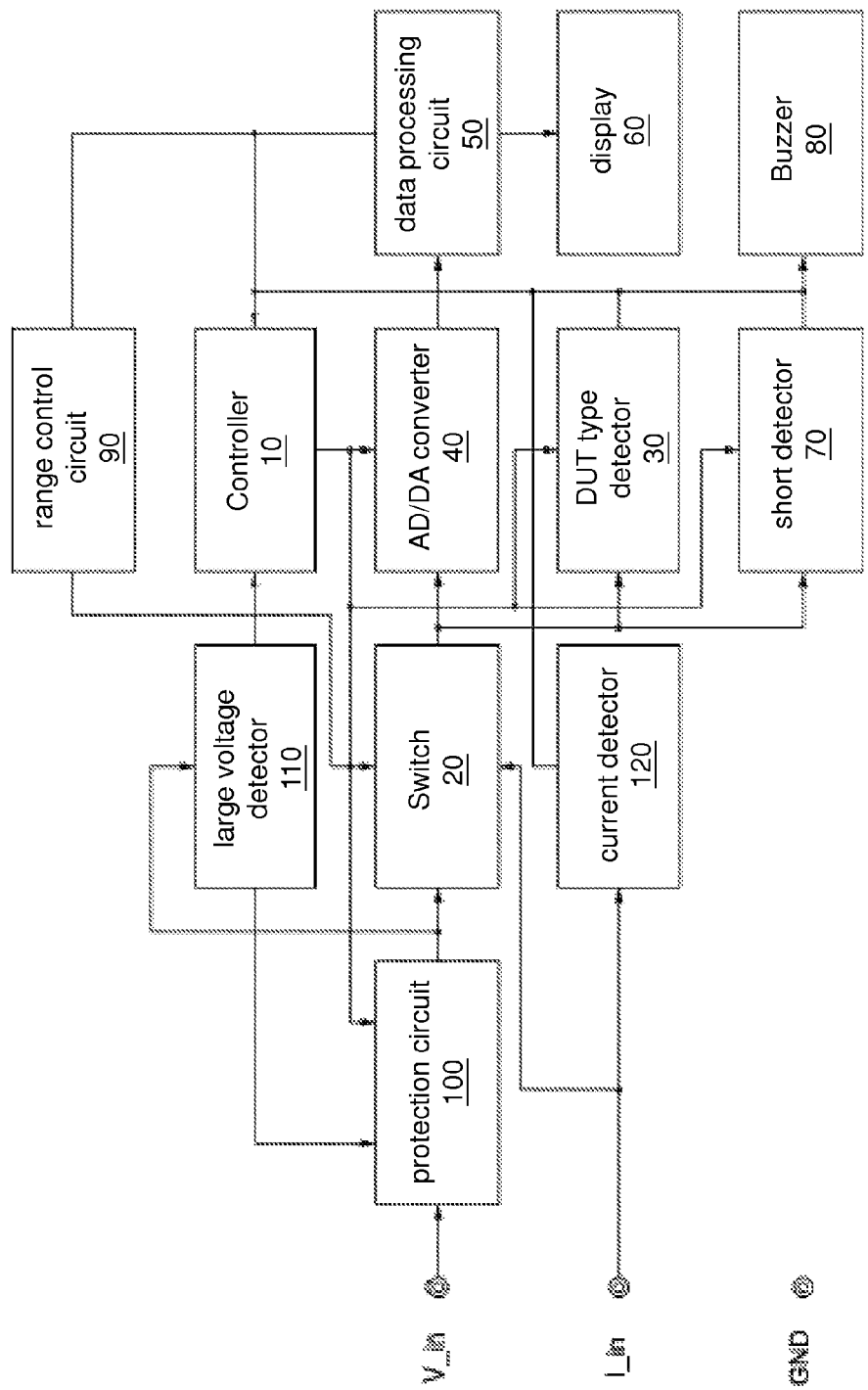
FIG. 1 is a circuit function block diagram of the present invention.

Referring to FIG. 1, which is a circuit function block diagram of measuring device with function of automatically determining the type of DUT of the present invention, including a controller 10, a switch 20, a DUT type detector 30, an AD/DA converter 40, a data processing circuit 50, a display 60, a short detector 70, a buzzer 80, a range control circuit 90, a protection circuit 100, a large voltage detector 110, and a current detector 120. Moreover, V_in and I_in are respectively input end of voltage and input end of current, and GND indicates a ground point.

The process of measurement is mainly divided into scan mode and measure mode, wherein the scan mode includes seven checking phases. The above-mentioned process is mainly controlled by the controller 10. In different checking phases, the controller 10 controls the switch 20, switching to different circuit configurations to output terminals of protection circuit 100: T1, T2, and T3; then DUT type detector 30 transmits detecting results of each checking phase to controller 10 for the controller 10 to determine the type of DUT and for measure mode to be activated. Meantime the controller 10 controls the switch 20, performs measurement according to the type of DUT, and transmits the result of measurement to the data processing circuit 50 for transferring the result of measurement into value, wherein the measurement unit in the present invention is composed of an AD/DA converter 40, a data processing circuit 50, and a range control unit 90; finally, the result of measurement is displayed on the display 60. In the above process, the current detector 120 is mainly used to detect whether there is current from input end I_in, the method of detection being to transmit a current signal to a resistor for converting it into a voltage signal to determine whether the voltage signal exceeds the default value. The large voltage detector 110 is used to detect whether there is large voltage signal from input end V_in. The short detector 70 is to detect whether there is short circuit between the input end V_in and the ground terminal GND; if there is short circuit, the buzzer 80 buzzes to caution the user. The range control unit 90 determines whether to switch the range for measuring or not according to the value transferred by the data processing circuit 50 before the measure mode is activated next time. And then the actions of scan and measure are continuously repeated.

Figure 2:
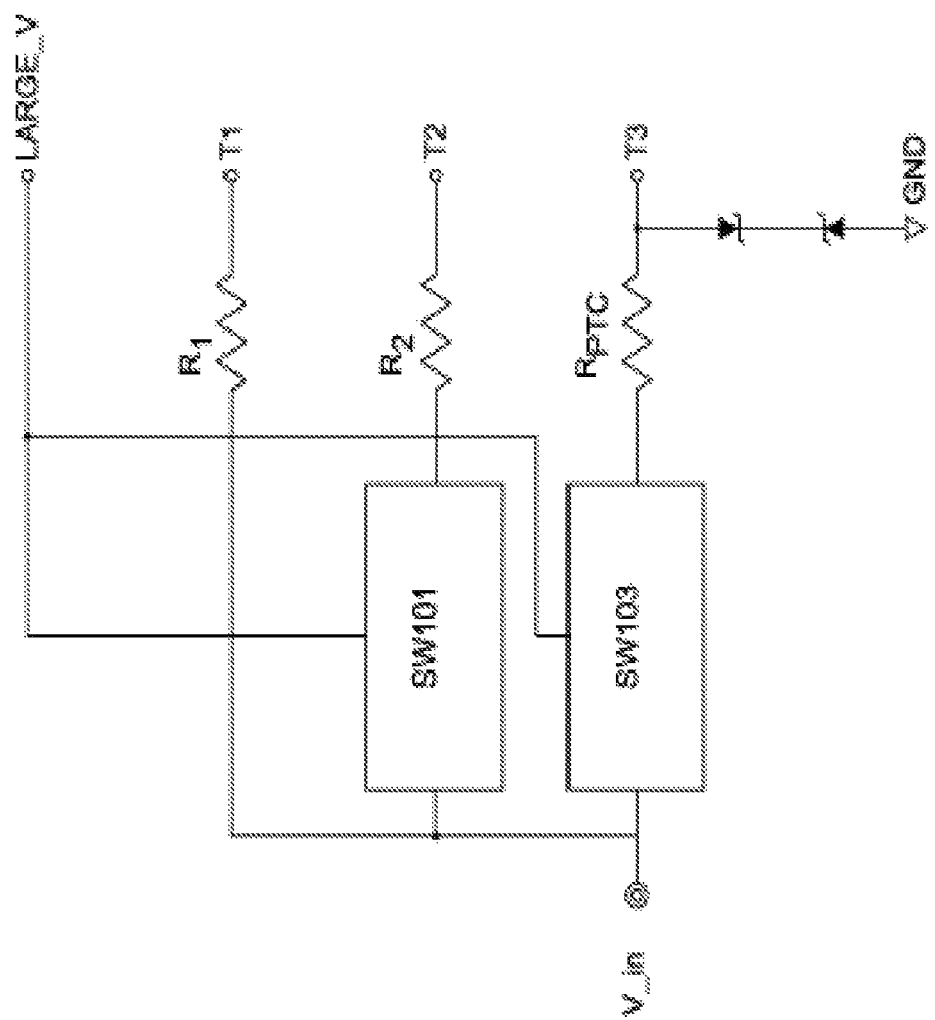
FIG. 2 is a circuit diagram of protection circuit of the present invention.

Then referring to FIG. 2, which is a circuit diagram of protection circuit of the present invention. The main objective of the protection circuit 100 is to protect circuit connected to terminals T1/T2/T3 for preventing circuit in the measuring device from being damaged when a high voltage signal is inputted. The protection circuit is mainly composed of two high voltage-resistant electric switches SW101/SW103, resistors R1/R2/$R_{PTC}$, and two clamping diodes D1/D2. In the present embodiment, the resistor value of resistor R1 is 10 MΩ, the resistor value of resistor R2 is 100KΩ, and the resistor $R_{PTC}$ can be a positive temperature coefficient thermistor, the resistor value of which is about 2KΩ. As resistor R1 is designed to be a large resistor, it can thus protect terminal T1 from being damaged by large voltage from the input end. And resistor R2 and resistor $R_{PTC}$ are designed to be with smaller resistor values, and therefore when a high voltage signal is connected to the input end, it is easy for circuit connecting to terminals T2 and T3 to be damaged and thus two electric switches SW101/SW103 need to be disposed between the resistor R2 and resistor $R_{PTC}$ and the input end. What is to be emphasized here is that, except under measure mode for measuring voltage and current, the electric switches SW101/SW103 are always on under other measure mode or scan mode. When the electric switches SW101/SW103 are on, the large voltage detector 110 continues detecting the potential of terminal T1; when the potential of terminal T1 is detected to be higher than the default value, a LARGE_V signal is transmitted to switches SW101/SW103 to turn the switches into open-circuit status for protecting the circuit connected to terminals T2 and T3. The electric switches SW101/SW103 as described above can be high voltage-resistant electric switches, such as relays or light control switches.

Figure 3:
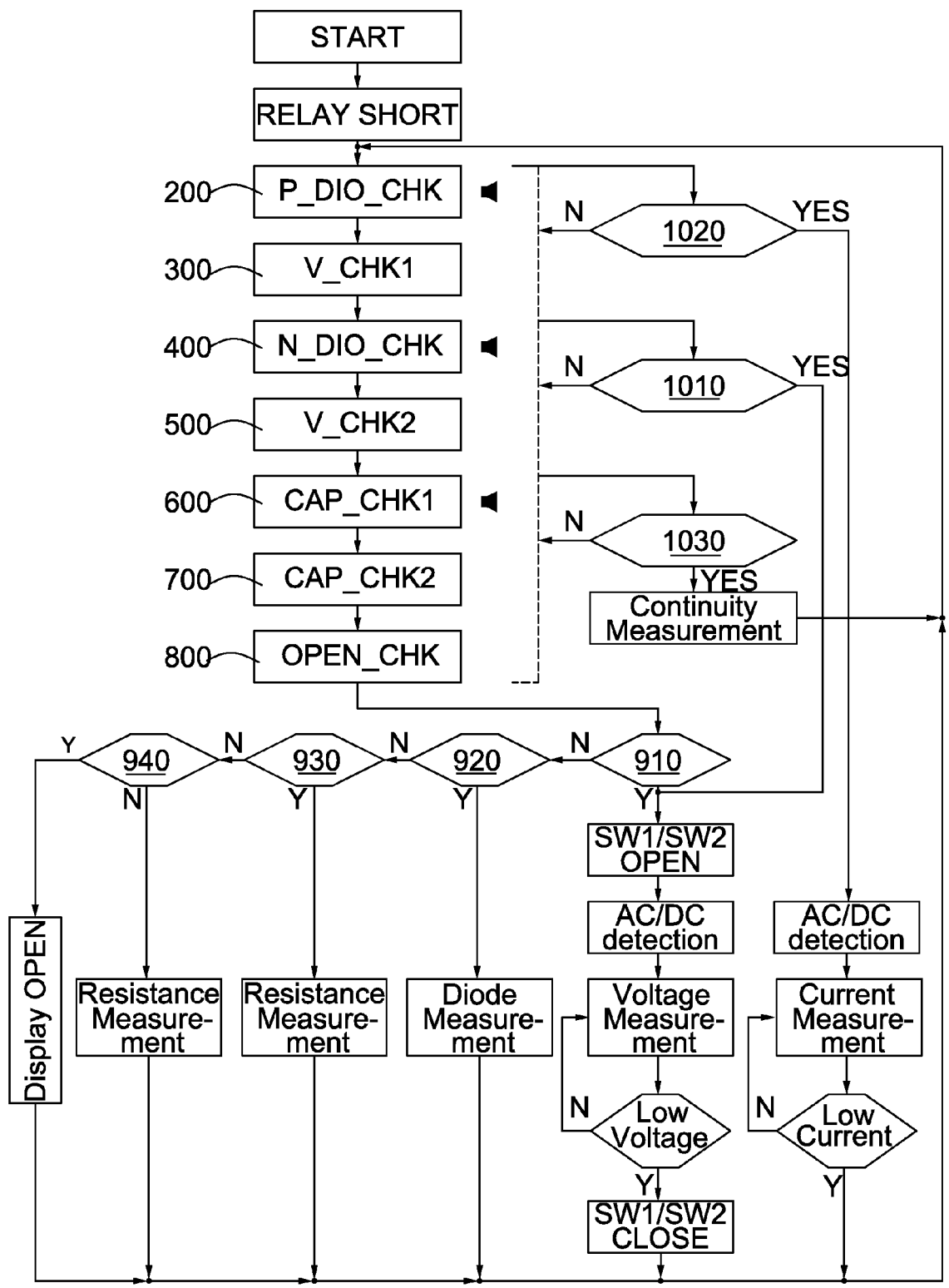
FIG. 3 shows detection and measurement process of the present invention.

Then referring to FIG. 3, which shows detection and determination process performed on DUT in the present invention. When the measuring device is activated, the controller 10 first transmits a signal to the protection circuit 100 to turn the electric switches SW101/SW103 on, and then the scan mode is activated, the scan mode including the following seven checking phases: PDIO_CHK, V_CHK1, NDIO_CHK, V_CHK2, CAP_CHK1, CAP_CHK2, and OPEN_CHK. Under scan mode, the controller 10 controls the whole measuring device and sequentially performs the above seven checking phases. And the switch 20 and electric switches SW101/SW103 are connected to three output terminals in the protection circuit 100, T1/T2/T3, according to different circuit configurations in keeping with different checking phases, as shown in FIGS. 4-9. The DUT type detector 30 detects the potential of input end according to circuit configuration of different checking phases and transmits the result of detection to the controller 10.

In the process in which the scan mode is performed, the large voltage detector 110, the current detector 120, and the short detector 70 are also activated at the same time. If the large voltage detector 110 detects large voltage from the input end, it directly interrupts the scan mode and determines the DUT as a voltage signal; meantime, the controller 10 transmits a LARGE_V signal to the protection circuit 100 to turn electric switches SW101/SW103 into open-circuit status and then performs AC/DC detection to determine whether the signal under test is an alternating current voltage or a direct current voltage. When the determination is completed, measurement of voltage is activated. If the voltage value obtained after measurement is smaller than a preset value, the controller 10 interrupts the voltage measure mode and transmits signal to the protection circuit 100 to turn electric switches SW101/SW103 on and the scan mode is re-activated; otherwise, the voltage measurement continues to be performed.

Moreover, in the process in which the scan mode is performed, if the current detector 120 detects current from the input end, it directly interrupts the scan mode and determines the DUT as a current signal; meantime, the controller 10 transmits a signal to the protection circuit 100 to turn electric switches SW101/SW103 into open-circuit status and then performs AC/DC detection to determine whether the signal under test is an alternating current or a direct current. When the determination is completed, measurement of current is activated. If the current value obtained after measurement is smaller than a preset value, the controller 10 transmits signal to the protection circuit 100 to turn electric switches SW101/SW103 on and the scan mode is re-activated; otherwise, the current measurement continues to be performed.

Furthermore, in the process in which the scan mode is performed, the short detector 70 is activated only when the following three checking phases PDIO_CHK, NDIO_CHK, and CAP_CHK1 are performed to detect whether there is short between input end V_in and the ground terminal GND. If the voltage difference between input end V_in and the ground terminal GND is detected to be very small and to continue for a short period of time exceeding the default time span, 2 ms for example, it is determined that there is short between input end V_in and the ground terminal GND, at the time of which the scan mode is directly interrupted and continuous measurement is activated. For example, when PDIO_CHK phase is performed, if the short detector 70 detects short, scan mode is interrupted and measure mode is immediately activated, and resistor value is outputted for the display 60 to display the resistor value. After the measurement is completed, the scan mode is re-activated.

In above process of detecting large voltage, current, or short, if more than two are detected at the same time, the order of priority for measurement is as following: large voltage>current> short detection.

In the process in which the scan mode is performed, if the DUT is not determined to be large voltage, current, or short, then after the seven checking phases are completed, the controller 10 makes determination according to result transmitted by the DUT type detector 30, wherein the voltage part is mainly determined according to the result of phases V_CHK1 and V_CHK2, and what is to be emphasized here is that the voltage here is different from large voltage as described above and refers to smaller voltage, for example, voltage within 5V; in addition, the diode is determined according to the result of phases P_DIO_CHK and N_DIO_CHK; the capacitor is determined according to the result of phases CAP_CHK1 and CAP_CHK2; when it is in open-circuit status, the determination is made according to the result of phase OPEN_CHK. The order of priority for determining the above-mentioned devices under test is as following: voltage>diode>capacitor>OPEN> resistor.

Then referring to FIG. 3. First, the determination of voltage is described. When V_CHK1 phase and V_CHK2 phase are performed, the controller 10 controls the switch 20 to perform a switching action for terminals T1/T2/T3 in the protection circuit to be connected according to circuit configuration shown in FIG. 4. What is to be further added is that, as the measuring device is already in the scan mode at the time, the electric switches SW101/SW103 in protection circuit are on, and therefore the resistor R2 and resistor $R_{PTC}$ are directly connected to input end V_in. First, as shown in FIG. 4, terminal T1 is connected to ground terminal GND, and terminal T2 is connected to comparator (not shown in Figure) in DUT type detector 30 for detecting potential of input end; moreover, terminal T3 is floating. Meantime, if there is voltage signal at the input end, terminal T2 is able to detect whether the input signal is large or small. When the V_CHK1 phase ends, if the potential of terminal T2 is detected to be lower than −Vr (for example, −Vr=−1.0V), the input signal is determined to be a voltage signal; or, when the V_CHK2 phase ends, if the potential of terminal T2 is detected to be higher than +Vr (for example, +Vr=+1.0V), the input signal is also determined to be a voltage signal.

Then, the determination of diode is described. The determination of whether the DUT is a diode or not is made according to the result of detection of P_DIO_CHK and N_DIO_CHK phases. When P_DIO_CHK phase is performed, the switch 20 receives signal from the controller 10 to perform a switching action for connecting the input end and the circuit configuration in FIG. 5(a) or FIG. 5(b). Meanwhile, terminal T3 in the circuit configuration is connected to positive bias voltage $V_{P1}$, for example, $V_{P1}$=+1.2V, terminal T1 is connected to the ground point (GND), and terminal T2 is connected to the comparator in DUT type detector 30 for detecting potential of input end V_in. When the input end is connected to the circuit configuration in FIG. 5(a), if the input end connects a diode of forward connection, as shown in FIG. 5(a), then potential of terminal T2 (i.e. $V_{T2}$) is clamped to on potential of diode, for example, $V_{T2}$=0.7V. At this time potential of $V_{T2}$ is within the range between "0V" and "+Vr", wherein +Vr is a potential smaller than positive bias voltage $V_{P1}$, for example, +Vr=+1.0V. Meantime, if the diode at the input end is in reverse connection, as shown in FIG. 5(b), the diode will not be turned on, and the potential of $V_{T2}$ at the time is the result of voltage division between resistor $R_{PTC}$ and resistor R1; since the resistor value of R1 is much larger than that of resistor $R_{PTC}$, the potential of $V_{T2}$ will be very close to the positive bias voltage $V_{P1}$.

This scan result is as shown in "Diode" row in table 1(a), and table 1(b) is a digital table correspondingly transferred from table 1(a). Therefore, it can be clearly seen from table 1(b) that, the scan result of P_DIO_CHK positive bias voltage scan signal provided by the controller 10 is "01" (diode in forward connection) and "10" (diode in reverse connection).

When N_DIO_CHK phase is performed, the switch 20 is required by the controller 10 to perform a switching action for connecting the input end to the circuit configuration in FIG. 6(a) or FIG. 6(b). Therefore, when the input end connects to the circuit configuration in FIG. 6(a), according to result shown in FIG. 5(a), it can be known that the potential of $V_{T2}$ will be close to negative bias voltage $V_{N1}$; and when the input end connects to the circuit configuration in FIG. 6(b), the potential of $V_{T2}$ will be between 0V and −Vr. This scan result can be seen clearly in table 1(b), which shows that the scan result of N_DIO_CHK negative bias voltage scan signal provided by the controller 10 is "01" (diode in forward connection) and "10" (diode in reverse connection).

Meantime, the comprehensive result of two checking phases P_DIO_CHK and N_DIO_CHK is as follows: when the diode is in forward connection, the scan result is "0101"; when the diode is in reverse connection, the scan result is "1010". Obviously, "0101" (forward connection) and "1010" (reverse connection) listed in table 1(b) are comprehensive result after the two checking phases P_DIO_CHK and N_DIO_CHK end. What is to be emphasized here is that, the reason why the above-mentioned circuit is used for the measurement of diode in the present invention is that it is probable that the user does not know polarity of diode, and thus in process of determination in the present invention, the circuit to determine diode is divided into: (a) DUT in forward connection and (b) DUT in reverse connection. In the process mentioned above, obviously, whether the DUT is in forward or reverse connection can be disregarded in the present invention since the final scan result can be determined to be diode by digital logic of table 1.

Moreover, potential range of VT2 measured by P_DIO_CHK and N_DIO_CHK signals in table 1(a) is compared by the comparator, and the result outputted by the comparator is stored when the P_DIO_CHK and N_DIO_CHK signals end and converted to digital logic, wherein table 1(b) is result of table 1(a) being converted to digital logic. What is to be emphasized here is that, the digital logic is preset in the controller 10 in the present invention. When the DUT type detector 30 transmits the digital logic of DUT to the controller 10, after the action of looking-up table is performed, the DUT can be immediately determined to be, for example, diode when the digital logic is "0101" or "1010". What is to be further emphasized here is that, the action of looking-up table is performed after all checking phases end, and herein the action of looking-up table is described in advance for depicting the relation between the scan result and the digital logic table.

After the two checking phases (or checking signals) P_DIO_CHK and N_DIO_CHK end, it can be seen from table 1(b) that digital logic of small capacitor is the same as that of large resistor, and meantime the digital logic of large capacitor is the same as that of small resistor. Obviously, in current condition, the action of looking-up table can only determine whether the DUT is diode or not, and below scan action is still needed for differentiating resistor from capacitor.

After the checking phases of voltage and diode end, the checking phases (CAP_CHK1 and CAP_CHK2) for capacitor are then activated. The two checking phases charge and discharge the DUT respectively.

Figures 7, 8, 9:
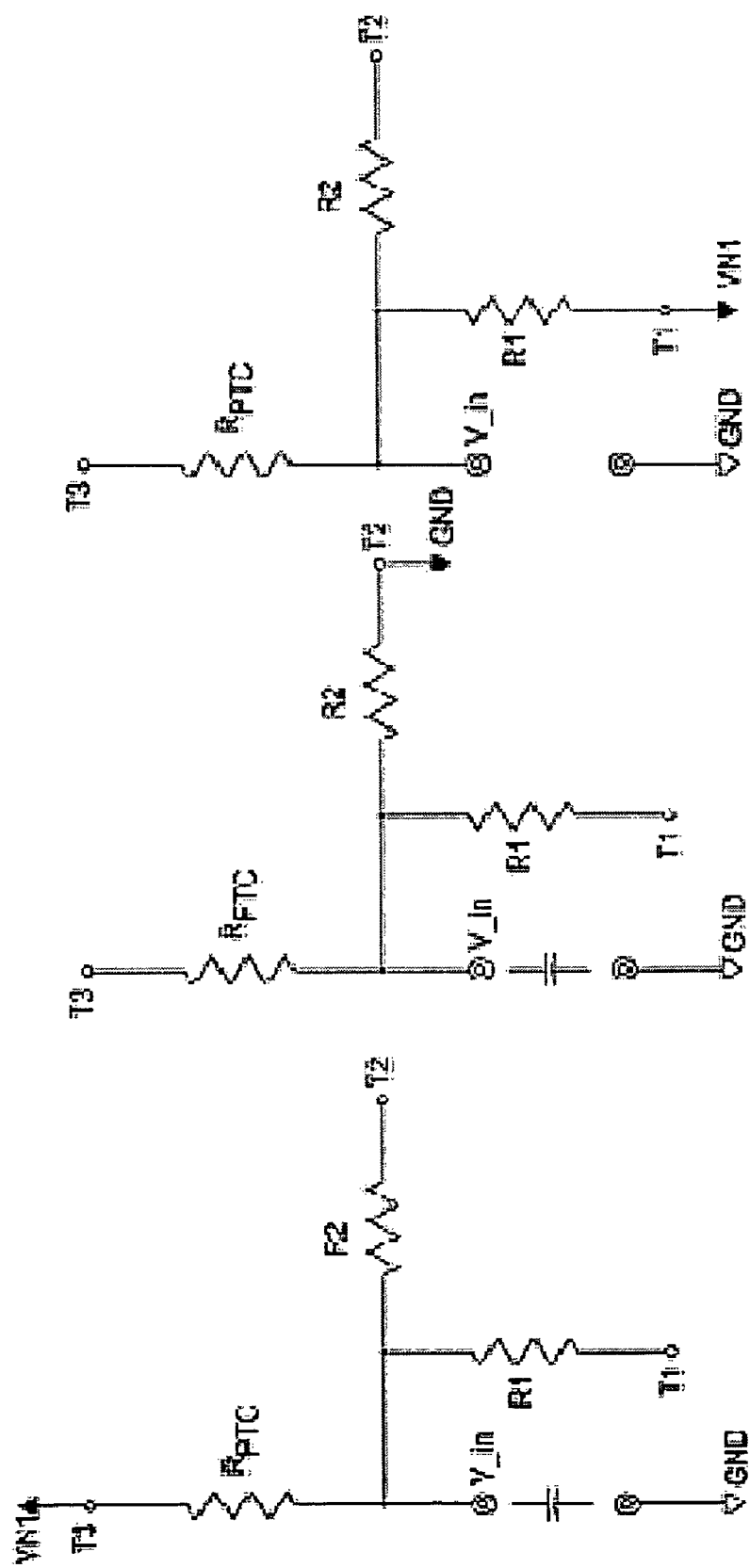
FIG. 7 is circuit configuration of CAP_CHK1 phase.
FIG. 8 is circuit configuration of CAP_CHK2 phase.
FIG. 9 is circuit configuration of OPEN_CHK phase.

When the CAP_CHK1 phase starts, the switch 20 is controlled by the controller 10 to perform a switching action for terminals T1/T2/T3 to connect according to circuit configuration in FIG. 7. Meantime, as shown in FIG. 7, terminal T3 is connected to negative voltage $V_{N1}$, terminal T2 is connected to comparator in DUT type detector 30 for detecting potential of input end, and terminal T1 is floating. When the CAP_CHK2 phase starts, the switch 20 performs the next switching action for terminals T1/T2/T3 to connect according to circuit configuration in FIG. 8. Meantime, as shown in FIG. 8, terminal T2 is connected to GND, terminal T3 is connected to comparator in DUT type detector 30 for detecting potential of input end, and terminal T1 is floating. Obviously, during CAP_CHK1 checking phase, the DUT at input end charges negative voltage $V_{N1}$ through resistor $R_{PTC}$; and during CAP_CHK2 checking phase, the DUT at input end discharges to the ground through resistor R2.

Figure 10A:
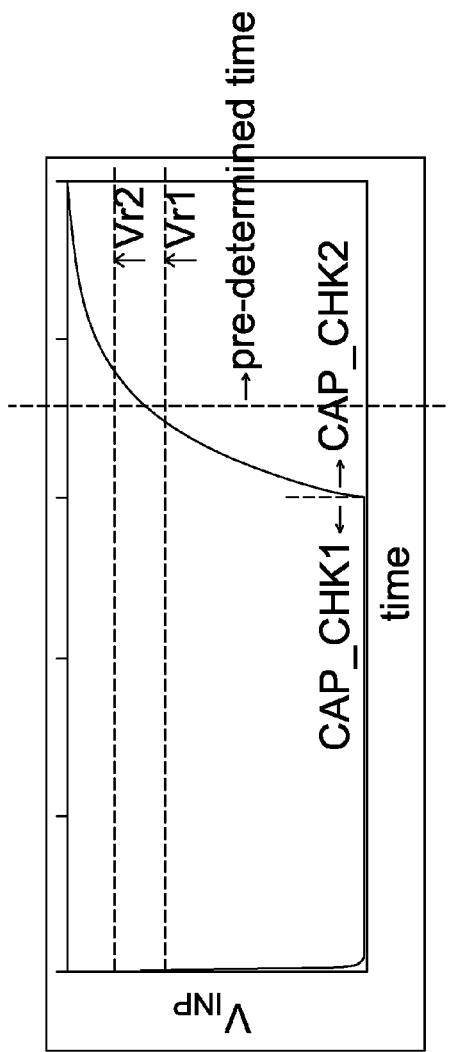
FIG. 10(a) to FIG. 10(d) show the changes of potential of input end with time in CAP_CHK1 and CAP_CHK2 phases.
Figure 10B:
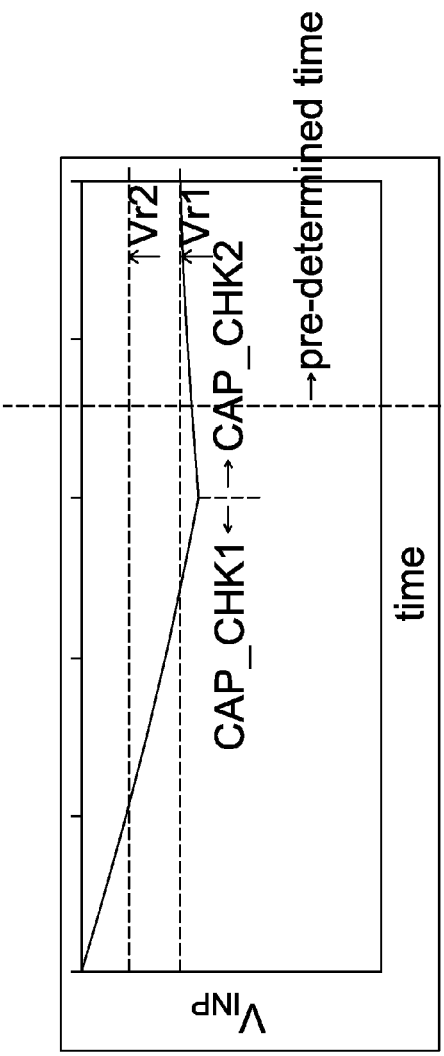
Figure 10C:
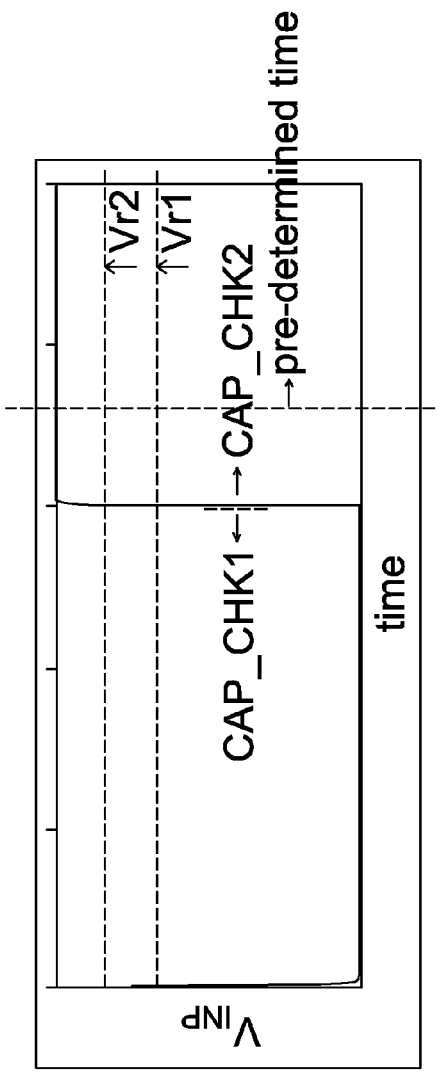
Figure 10D:
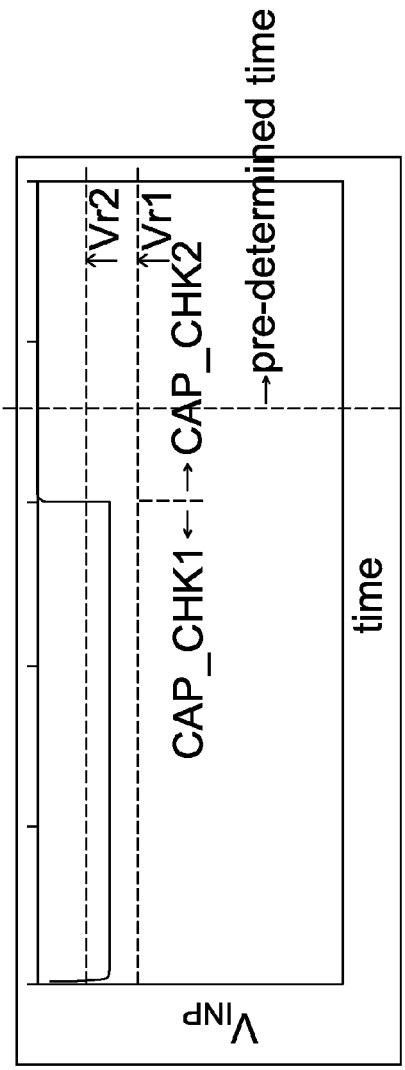

Then referring to FIG. 10, which shows the changes of voltage with time of different capacitors and resistors according to circuit configuration of present invention as shown in FIG. 7 and FIG. 8, wherein DUT in FIG. 10(a) is small capacitor, DUT in FIG. 10(b) is large capacitor, DUT in FIG. 10(c) is large resistor, and DUT in FIG. 10(d) is small resistor. In the present embodiment, the resistor value of resistor R2 is much larger than that of resistor $R_{PTC}$. Moreover, FIG. 10(a) and FIG. 10(b) are also waveform charts indicating determination of capacitor of the present invention, wherein x-axis is time axis and y-axis indicates input voltage ($V_{INP}$); $V_{INP}$ being potential of terminal T2 during checking phase CAP_CHK1 and being potential of terminal T3 during checking phase CAP_CHK2. Wherein FIG. 10(a) is a waveform chart indicating the change of $V_{INP}$ with time when the DUT is a small capacitor, and FIG. 10(b) is a waveform chart indicating the change of $V_{INP}$ when the DUT is a large capacitor. DUT is determined to be capacitor when the potential of input end meets two criteria: first, absolute value of potential of input end $|V_{INP}|$ is larger than $|V_{r1}|$ before the checking phase CAP_CHK1 ends, and second, $|V_{INP}|$ continues to be larger than $|V_{r2}|$ from the start of checking phase CAP_CHK2 till the end of a pre-determined time period. As shown in FIG. 10(a) and FIG. 10(b), obviously, no matter the DUT at input end is large capacitor or small capacitor, the two criteria described above can be fulfilled.

Then, in detection circuit configuration as shown in FIG. 7 and FIG. 8, if the DUT is not a capacitor but a resistor, $V_{INP}$ will be determined by the divided voltage theory between DUT and resistor $R_{PTC}$ in CAP_CHK1 phase and determined by divided voltage between DUT and resistor R2 in CAP_CHK2 phase. Thus, as shown in FIG. 10(c), if the input end is a large resistor or open circuit, in CAP_CHK1 phase, the potential of $V_{INP}$ will soon reach a potential standard very close to that of $V_{N1}$, and the first criterion that "absolute value of potential of input end $|V_{INP}|$ is larger than $|V_{r1}|$ can be fulfilled; and in CAP_CHK2 phase, the potential of $V_{INP}$ can also reach the potential standard of GND soon. Meantime, before a pre-determined time (1 ms for example), $|V_{INP}|$ is smaller than $|V_{r2}|$, and the second criterion that "$|V_{INP}|$ continues to be larger than $|V_{r2}|$ from the start of checking phase CAP_CHK2 till the end of a pre-determined time period" is not fulfilled. Furthermore, as shown in FIG. 10(d), when the input end is small resistor, before CAP_CHK1 phase ends, $|V_{INP}|$ is not larger than $|V_{r1}|$ and the first criterion is not met; and when CAP_CHK2 phase starts, $V_{INP}$ reaches the potential standard of ground soon and the second criterion is not met either. So when resistor or open circuit is inputted, the two criteria cannot be fulfilled at the same time. Therefore, with two checking phases CAP_CHK1 and CAP_CHK2, the capacitor can be distinguished.

Finally, when CAP_CHK2 phase ends, OPEN_CHK phase starts. During this phase the switch 20 is controlled by the controller 10 to perform switch action to connect terminals T1/T2/T3 according to circuit configuration as shown in FIG. 9, wherein terminal T1 is connected to a negative potential $V_{N1}$, terminal T3 is connected to comparator in DUT type detector 30 for detecting potential of input end, and terminal T2 is floating, R1 being a large resistor. When the input end is open, the potential of terminal ($V_{T3}$) is very close to potential of $V_{N1}$, and there is no such property if the DUT is a resistor. Therefore, the relationship between $V_{T3}$ and $V_{N1}$ in circuit configuration in FIG. 9 can be used for determining whether the input end is open or resistor.

The way in which DUT is determined by the above scan mode is as shown in FIG. 3, which is a flow chart of measuring device with function of automatically determining type of DUT of the present invention. First, under scan mode, the controller 10 sequentially generates seven checking phases, P_DIO_CHK, V_CHK1, N_DIO_CHK, V_CHK2, CAP_CHK1, CAP_CHK2, and OPEN_CHK in each scan cycle, such as scan procedures 200 to 800. The switch 20 then performs switching procedure according to these scan signals to switch different circuit configurations to input end; comparator in DUT type detector 30 then performs a comparison procedure for comparing the potential of input end of different circuit configurations and transmits the comparison results to the controller 10 after the scan cycle ends; determination procedure is then performed for sequentially performing voltage determination 910, diode determination 920, capacitor determination 930, and open circuit determination 940; the DUT is determined to be a resistor when the result of open circuit determination is "non-open".

During the process of above scan mode, if large voltage 1010 or current 1020 or short circuit 1030 is detected, the scan mode is interrupted, and the measure mode starting after signal is detected is directly activated. If no large voltage or current or short circuit is detected, then after the seven checking phases end, the controller 10 performs an action of determination, i.e. an action of table look-up for distinguishing whether DUT is voltage, diode, capacitor, resistor, or open circuit. The way of determination is listed below:

1. Determining first whether DUT is a voltage signal according to scan result of V_CHK1 and V_CHK2;
2. If DUT is not voltage, looking up table according to scan result of P_DIO_CHK and N_DIO_CHK to determine whether DUT is a diode;
3. If DUT is neither voltage nor diode, determining whether DUT is a capacitor according to scan result of CAP_CHK1 and CAP_CHK2;
4. Finally, if DUT is neither voltage nor capacitor, determining whether input end is open circuit according to scan result of OPEN_CHK, if not open, determining DUT to be a resistor, if yes, activating the next scan cycle and continuing to scan.

Obviously, since the determination procedure of the present invention is able to determine whether DUT is voltage, current, diode, large capacitor/large resistor, or small capacitor/small resistor, appropriate range for measuring can thus be automatically selected for measurement and the goal of fast measurement and less power consumption can also be achieved.

When the type of DUT is determined by scan mode, the measure mode then starts for the measurement unit to perform measurement. The result of measurement is then converted to value by data processing circuit 50 and displayed on the display 60, wherein the measurement unit in the present invention is composed of AD/DA converter 40, a data processing unit 50, and a range control unit 90. What is to be emphasized here is that, the characteristic of the present inventions is in that a determination circuit for determining DUT is further added to current functions of multi-meter. The determination circuit is used to automatically determine the type of DUT, i.e. distinguishing among voltage, current, diode, capacitor, resistor and open circuit, and the DUT is then measured by measurement unit of prior art, wherein measurement unit of prior art can be measurement unit as disclosed in U.S. Pat. Nos. 4,556,986, 4,588,983, and 6,646,562, which is not limited in the present invention.

Figure 11:
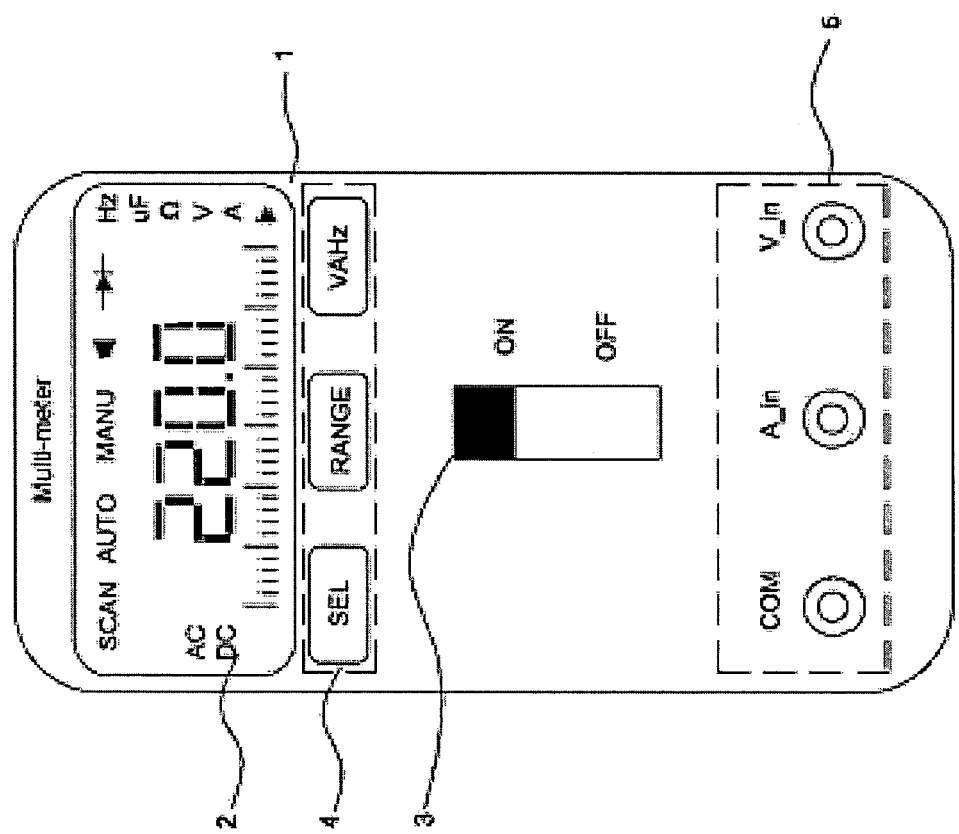
FIG. 11 shows measuring device of the present invention with function of automatically determining type of DUT.

Then, referring to FIG. 11, which is a view of appearance of measuring device of the present invention with function of automatically selecting measuring function. As shown in FIG. 11, the operation of measuring device of the present invention with function of automatically selecting measuring function is described as follows: measuring device 1 is disposed with display 2 for displaying currently selected measuring function and measured value, wherein SCAN indicates scan mode of automatic determination as currently selected, AUTO indicates general measure mode of automatic range switching as currently selected, and MANU indicates general measure mode of manually fixed range as currently selected. The measuring device is also disposed with a switch 3 for switching on and switching off the device. Moreover, the multi-meter 1 is disposed with a plurality of additional function keys 4, including SEL (measure mode function key), RANGE (specific measurement range function key), and VAHz (frequency measurement function key). Furthermore, the multi-meter 1 is disposed with a pair of inputs 5, on which can be further disposed with test pin socket or test probe (not shown in Figure). Wherein SEL (measure mode function key) can function as switch for switching on/off the device; for example, when the user presses SEL key for more than 2 seconds, the meter is switched off; and if the SEL key is pressed for more than 2 second when the meter is in off status, the meter is switched on; in such mode of operation, SEL key can substitute the function of switch 3.

Among the plurality of measure modes of the measuring device 1 of the present invention, at least a pre-set automatic scan mode (SCAN) is included, the mode of which is able to automatically determine whether there is DUT at input end at any time and automatically determine the type of DUT connecting to input 5, and also to perform value measurement on DUT after the type of DUT is determined; details of circuit and process of determination is already described in the above and will not be repeated herein. In the following other operating functions of measuring device 1 is described.

First, the design of SEL key among additional function keys 4 is to make it more convenient for the user to terminate scan mode and switch between functions for determining direct current voltage/alternating current voltage/direct current/alternating current/resistor/capacitor/diode/short by manually selecting the mode for measurement. For example, when the input signal is a direct current voltage with a small alternating current voltage, under automatic scan mode (SCAN), obviously, the measuring device 1 will determine the signal under test to be a direct current voltage, perform measurement, and display the value of direct current voltage on display 2. If what the user wants to measure is the small alternating current voltage signal on the direct current voltage, the SEL key can be used to switch to alternating current voltage mode; at the time, measuring device 1 will display the value of small alternative current voltage signal on display 2.

Furthermore, VAHz key among additional function keys 4 is used when the input signal is an AC voltage or current signal and the user wants to measure frequency of the signal in addition to voltage or current value of the signal, and thus the additional function key VAHz can be used for switching to frequency measurement mode.

In addition, RANGE key among additional function keys 4 is for the user to switch to measure mode of manually fixed range (MANU). The meter of the present invention automatically switches to appropriate range for measurement according to status of the signal. However, in some occasions, the user may want to keep the range fixed; for example, when frequency of a variable frequency signal is measured, the range needs to be fixed to avoid repeatedly switching with time.

What is to be emphasized here is that, when measuring device 1 of the present invention is operated, automatic scan mode (SCAN) is pre-set for activation to automatically determine the type of DUT and thus the switch to select DUT is not needed. What is more particular is that, in the process in which scan mode is activated, large voltage detector 110, current detector 120, and short detector 70 are activated at the same time. And additional function keys 4 are manually selected by the user, which can only be selected for testing specific functions and thus do not influence the operation of function of automatic scan and determination of measuring device 1. In addition, function keys such as HOLD key (value kept on display), MAX/MIN (maximum/minimum value), and BLT (backlight activation) can also be further added on measuring device 1 of the present invention. However, all these function keys can also be removed and only SEL key is kept for switching on/off the device to make the operation of multi-meter 1 as simple as possible, as shown in FIG. 11.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A measuring device with function of automatically selecting measuring function, comprising:
   a controller for sequentially providing a plurality of checking phases;
   a protection circuit with a first end connecting to an input end connected with DUT and a second end connecting to said controller, performing switching action according to signal of said controller;
   a switch composed of a plurality of test circuits, with a first end connecting to third end of said protection circuit, a second end connecting to said controller and sequentially performing switching action according to said plurality of checking phases for sequentially connecting said plurality of test circuits with said protection circuit, and said third end connecting to a current input end; and
   a DUT type detector with a first end connecting to a third end of said switch, sequentially comparing voltage of said input end with a comparison circuit and transmitting the result of comparison to said controller with a second end;
   wherein said controller determines type of DUT according to result of comparison transmitted by said DUT type detector.

2. The measuring device according to claim 1, wherein said protection circuit includes a pair of electric switches and said pair of electric switches are under control of said controller.

3. The measuring device according to claim 1, further comprising a large voltage detector, with first end connecting to said second end of said protection circuit, second end connecting to said controller, and third end connecting to said third end of said protection circuit.

4. The measuring device according to claim 1, further comprising a current detector, with first end connecting to said current input end, and second end connecting to said controller.

5. The measuring device according to claim 1, further comprising a short detector, with first end connecting to said third end of said switch, and second end connecting to said controller.

6. The measuring device according to claim 5, wherein said short detector is further connected to a buzzer.

7. The measuring device according to claim 1, wherein a plurality of scan modes provided by said controller are sequentially for: voltage, diode, capacitor, open detection.

8. The measuring device according to claim 7, wherein said diode detection mode is further divided into a positive bias voltage scan signal and a negative bias voltage scan signal.

9. The measuring device according to claim 1, wherein test said plurality of circuits of said switch are selected from the group consisting of: an input voltage test circuit configuration, a diode positive bias voltage test circuit configuration, a diode negative bias voltage test circuit configuration, a capacitor charging test circuit configuration, a capacitor discharging test circuit configuration, and an open test circuit configuration.

10. The measuring device according to claim 9, wherein said input voltage test circuit configuration comprises:
- an input end of voltage under test;
- a first terminal, connecting to said input end of voltage under test through a first resistor;
- a second terminal, connecting to said input end of voltage under test through a second resistor; and
- a third terminal, connecting to said input end of voltage under test through a PTC resistor $R_{PTC}$;
- wherein said second terminal and said third terminal are floating and said first terminal connects to ground.

11. The measuring device according to claim 9, wherein said diode positive bias voltage test circuit configuration in said switch comprises:
- an input end of DUT;
- a first terminal, connecting to said input end of DUT through a first resistor;
- a second terminal, connecting to said input end of DUT through a second resistor; and
- a third terminal, connecting to said input end of DUT through a PTC resistor $R_{PTC}$;
- wherein said second terminal connects to comparator in said DUT type detector, said third terminal connects to a positive voltage, and said first terminal connects to ground.

12. The measuring device according to claim 9, wherein said diode negative bias voltage test circuit configuration in said switch comprises:
- an input end of DUT;
- a first terminal, connecting to said input end of DUT through a first resistor;
- a second terminal, connecting to said input end of DUT through a second resistor; and
- a third terminal, connecting to said input end of DUT through a PTC resistor $R_{PTC}$;
- wherein said second terminal connects to comparator in said DUT type detector, said third terminal connects to a negative voltage, and said first terminal connects to ground.

13. The measuring device according to claim 9, wherein said capacitor charging test circuit configuration in said switch comprises:
- an input end of DUT;
- a first terminal, connecting to said input end of DUT through a first resistor;
- a second terminal, connecting to said input end of DUT through a second resistor; and
- a third terminal, connecting to said input end of DUT through a PTC resistor $R_{PTC}$;
- wherein said second terminal connects to comparator in said DUT type detector, said third terminal connects to a negative voltage, and said first terminal is floating.

14. The measuring device according to claim 9, wherein said capacitor dis-charging test circuit configuration in said switch comprises:
- an input end of DUT;
- a first terminal, connecting to said input end of DUT through a first resistor;
- a second terminal, connecting to said input end of DUT through a second resistor; and
- a third terminal, connecting to said input end of DUT through a PTC resistor $R_{PTC}$;
- wherein said second terminal connects to ground, said third terminal connects to comparator in said DUT type detector, and said first terminal is floating.

15. The measuring device according to claim 9, wherein said open test circuit configuration in said switch comprises:
- an input end of DUT;
- a first terminal, connecting to said input end of DUT through a first resistor;
- a second terminal, connecting to said input end of DUT through a second resistor; and
- a third terminal, connecting to said input end of DUT through a PTC resistor $R_{PTC}$;
- wherein said third terminal connects to comparator in said DUT type detector, said second terminal is floating, and said first terminal connects to a negative voltage.

16. The measuring device according to claim 1, wherein said controller performs look-up table to compare result of comparison against a pre-set table for determining type of DUT.

17. The measuring device according to claim 16, wherein said pre-set table is a pre-set logic table.

18. A measuring device with function of automatically selecting measuring function, comprising:
- a controller for sequentially providing a plurality of checking phases;
- a protection circuit with a first end connecting to an input end connected with DUT and a second end connecting to said controller, performing switching action according to signal of said controller;
- a switch composed of a plurality of test circuits, with a first end connecting to third end of said protection circuit, a second end connecting to said controller and sequentially performing switching action according to said plurality of checking phases for sequentially connecting said plurality of test circuits with said protection circuit, and a third end connecting to a current input end;
- a DUT type detector with a first end connecting to said third end of said switch, sequentially comparing voltage of said input end with a comparison circuit and transmitting the result of comparison to said controller with a second end; and
- a measurement unit, connecting to said controller for performing measurement on said DUT.

19. The measuring device according to claim 18, wherein said measurement unit is composed of a AD/DA converter, a data processing unit, and a range control circuit.

20. The measuring device according to claim 19, further comprising a display for connecting with said data processing unit.

* * * * *